United States Patent
de la Llera et al.

(10) Patent No.: US 8,847,495 B2
(45) Date of Patent: Sep. 30, 2014

(54) MOVABLE GROUNDING ARRANGEMENTS IN A PLASMA PROCESSING CHAMBER AND METHODS THEREFOR

(75) Inventors: Anthony de la Llera, Fremont, CA (US); Michael C. Kellogg, Oakland, CA (US); Alexei Marakhtanov, Albany, CA (US); Rajinder Dhindsa, Pleasanton, CA (US)

(73) Assignee: Lam Research Corporation, Fremont, CA (US)

(*) Notice: Subject to any disclaimer, the term of this patent is extended or adjusted under 35 U.S.C. 154(b) by 55 days.

(21) Appl. No.: 13/616,641

(22) Filed: Sep. 14, 2012

(65) Prior Publication Data

US 2013/0134876 A1    May 30, 2013

Related U.S. Application Data

(60) Provisional application No. 61/564,512, filed on Nov. 29, 2011.

(51) Int. Cl.
*H01J 7/24*      (2006.01)

(52) U.S. Cl.
USPC ............ 315/111.21; 315/114.41; 315/111.51; 315/111.81

(58) Field of Classification Search
USPC .................................................. 315/111.21
See application file for complete search history.

(56) References Cited

U.S. PATENT DOCUMENTS

| | | | | |
|---|---|---|---|---|
| 7,393,432 B2 * | 7/2008 | Dhindsa et al. | ........... | 156/345.44 |
| 7,777,599 B2 * | 8/2010 | Shannon et al. | ............. | 333/227 |
| 2006/0065369 A1 | 3/2006 | Dhindsa et al. | | |
| 2009/0200269 A1 | 8/2009 | Kadkhodayan et al. | | |
| 2010/0089319 A1 * | 4/2010 | Sorensen et al. | ........... | 118/723 E |
| 2010/0154709 A1 | 6/2010 | Fischer et al. | | |
| 2010/0154996 A1 | 6/2010 | Hudson et al. | | |
| 2010/0176086 A1 * | 7/2010 | Iwata | ............................... | 216/71 |
| 2011/0100552 A1 | 5/2011 | Dhindsa et al. | | |
| 2012/0000605 A1 * | 1/2012 | Kellogg et al. | ............. | 156/345.1 |
| 2012/0000608 A1 * | 1/2012 | Kellogg et al. | ........... | 156/345.43 |

OTHER PUBLICATIONS

"International Search Report", PCT Application No. PCT/US 12/65214, Mailing Date: Jan. 31, 2013.
"Written Opinion", PCT Application No. PCT/US 12/65214, Mailing Date: Jan. 13, 2013.

* cited by examiner

*Primary Examiner* — Douglas W Owens
*Assistant Examiner* — Srinivas Sathiraju
(74) *Attorney, Agent, or Firm* — Martine Penilla Group, LLP

(57) ABSTRACT

A plasma processing systems having at least one plasma processing chamber, comprising a movable grounding component, an RF contact component configured to receive RF energy from an RF source when the RF source provides the RF energy to the RF contact component, and a ground contact component coupled to ground. The plasma processing system further includes an actuator operatively coupled to the movable grounding component for disposing the movable grounding component in a first position and a second position. The first position represents a position whereby the movable grounding component is not in contact with at least one of the RF contact component and the ground contact component. The second position represents a position whereby the movable grounding component is in contact with both the RF contact component and the ground contact component.

15 Claims, 3 Drawing Sheets

MOVABLE GROUNDING ARRANGEMENTS IN A PLASMA PROCESSING CHAMBER AND METHODS THEREFOR

PRIORITY CLAIM

This application claims priority under 35 USC. 119(e) to a commonly-owned provisional patent application entitled "Movable Grounding Arrangement In A Plasma Processing Chamber And Methods Therefor", U.S. Application No. 61/564,512, filed on Nov. 29, 2011 by Anthony de la Llera et al., all of which are incorporated herein by reference.

BACKGROUND OF THE INVENTION

In some plasma processing chambers, the upper electrode can be configured to execute in the grounded mode or the RF-powered mode. Generally speaking, the bottom electrode that supports the substrate may be powered with an appropriate RF power source (which may provide one or more RF signals to the bottom electrode). The upper electrode may be grounded as is conventional in a capacitively coupled plasma processing chamber or may be powered with one or more RF signals. When the upper electrode is configured to execute in the RF-powered mode, RF power is supplied to the upper electrode. When the upper electrode is configured to run in the grounded mode, the upper electrode is grounded.

While there exist many techniques to alternately couple the upper electrode to ground or to an RF source, engineers are constantly looking for ways to improve the reliability and the maintainability of the chamber. Given the high energy and high RF frequency involved in RF electrode operation, reliability and maintainability of the switching mechanism is paramount. If the switching from the RF-powered mode to the grounded mode (and vice versa) is improperly designed, arcing may result and may detrimentally affect the grounding and/or RF connection and may alter the process result from substrate to substrate. Furthermore, a more robust switching mechanism may extend the service interval, allowing the plasma processing system to operate for a longer period of time before maintenance and/or replacement is required.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
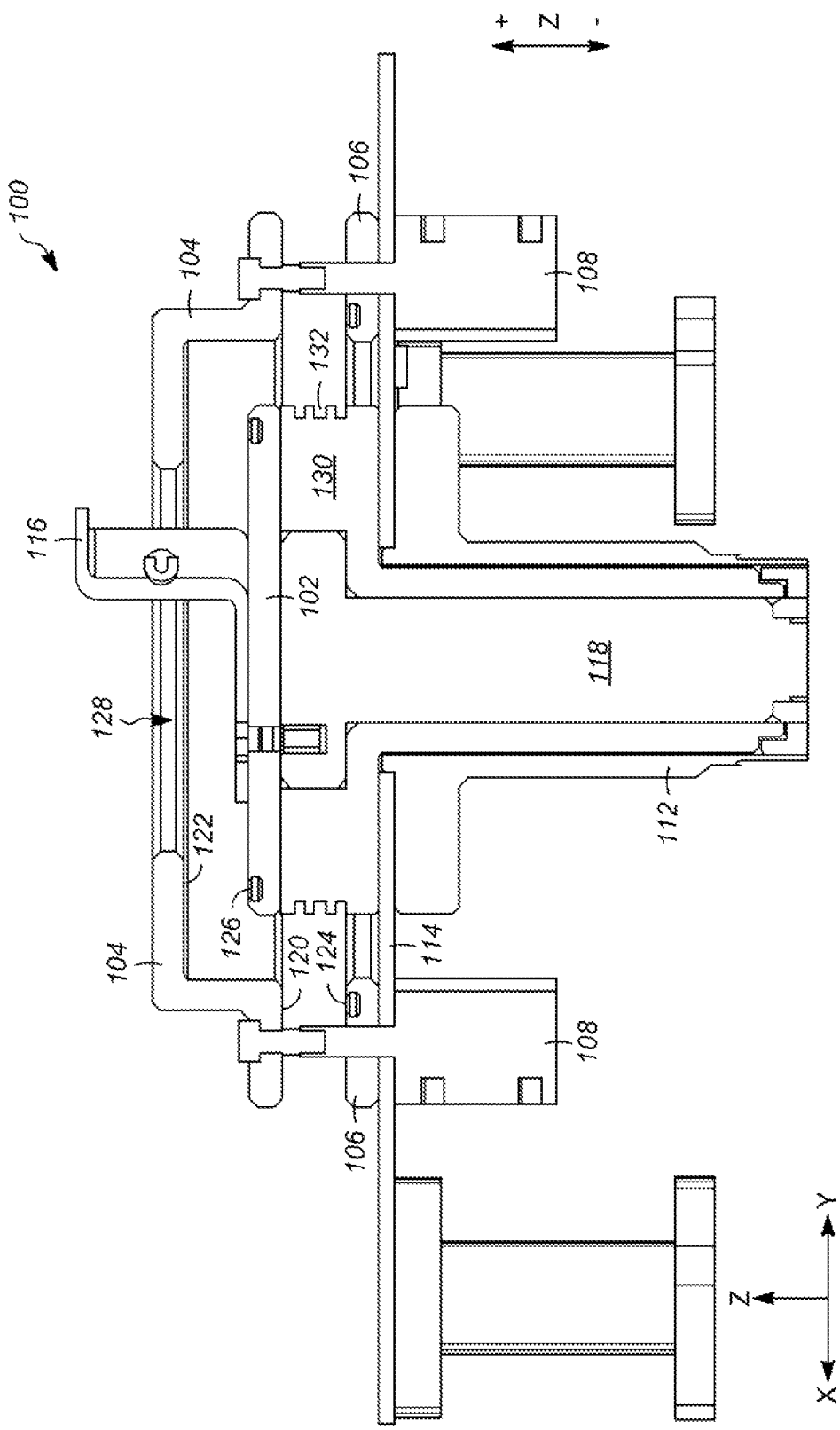
FIG. 1 shows, in accordance with embodiments of the invention, a portion of the switching mechanism employed for selectively and alternately provide ground and RF energy to the upper electrode.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. The computer readable medium may include non-transitory (i.e., not in wave form) computer readable medium. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for grounding an RF electrode in a plasma processing chamber of a plasma processing system. In the following example, a capacitively coupled plasma processing chamber in which the upper electrode can be operated in either the RF-powered mode or the grounded mode is employed to illustrate the inventive switching arrangement. It should be understood, however, that the invention is not limited to the examples herein and may be practiced in different plasma processing systems employing different configurations, geometries, and plasma-generating technologies (such as inductively coupled systems, electron-cyclotron resonance systems, microwave systems, etc.).

In one or more embodiments, there is provided a movable grounding component that is made of a conductive material and is configured to make or break contact with both a RF contact component and a ground contact component (which is grounded). The movable grounding component, in the first position, is spatially separate from both the RF contact component and the ground contact component. In this first position, RF energy may be provided to the RF contact component, which serves as a pathway for RF energy to be provided to an upper electrode plate. In the second position, the movable grounding component physically couples with both the RF contact component and the ground contact component, thereby coupling the RF contact component to ground and thus grounding the RF contact component. In this second position, RF energy is preferably not provided to the RF contact component, thereby allowing the upper electrode that is coupled to the RF contact component to be grounded instead.

In one or more embodiments, the movable grounding component is a plate-shaped component. In one or more embodiments, the movable grounding component is a ring-shaped component. In one or more embodiments, the movable grounding component is a ring-shaped component with an RF strap fed through a hole disposed in the movable grounding component. In one or more embodiments, the movable grounding component is a hat-shaped component. In one or more embodiments, the movable grounding component is a hat-shaped component having therein a hole to allow an RF strap to feed through. In one or more embodiments, the movable grounding component is made of a conductive material such as aluminum.

In one or more embodiments, the RF contact component is coupled to both an RF strap for receiving RF energy from an RF power supply and to a conductor for providing the RF energy to the upper electrode plate. In one or more embodiments, the grounded contact component and the RF contact component are co-planar. In one or more embodiments, the grounded contact component and the RF contact component are separated in the z-direction to minimize arcing.

In one or more embodiments, the RF contact component is a plate-shaped component. In one or more embodiments, the RF contact component is a ring-shaped component. In one or more embodiments, the RF contact component is a hat-shaped component. In one or more embodiments, the RF contact component is made of a conductive material such as aluminum.

In one or more embodiments, the ground contact component is a plate-shaped component. In one or more embodiments, the ground contact component is a ring-shaped component. In one or more embodiments, the ground contact component is a hat-shaped component. In one or more embodiments, the ground contact component is made of a conductive material such as aluminum.

In one or more embodiments, the movable grounding component is disposed above both the RF contact component and the ground contact component in the first position and also in a non-contacting relationship with both the RF contact component and the ground component when the upper electrode is run in the RF-powered mode. In one or more embodiments, the movable grounding component is moved into the second position whereby the movable grounding component physically contacts both the RF contact component and the ground contact component when the upper electrode is run in the grounded mode.

In a preferred embodiment, the movable grounding component is ring-shaped or hat-shaped with a hole therein to allow an RF strap to be fed through. The RF strap is coupled to the RF contact component, which is disposed below the movable grounding component. The RF contact component is also electrically coupled to the upper electrode plate to provide RF power to the upper electrode plate when the RF contact component receives RF energy from an RF energy source via the RF strap and the RF contact component is not grounded. The movable grounding component is moved upward to be disposed in a non-contact relationship with the RF contact component when the upper electrode runs in the RF-powered mode. The movable grounding component is moved downward to physically contact both the ground contact component and the RF contact component, thereby grounding the RF contact component when it is desired to operate the upper electrode in the grounded mode.

If the RF contact component and the ground contact component are co-planar, the movable-grounding component may be ring-shaped. If the RF contact component and the ground contact component are non co-planar in the Z direction, the movable grounding component may be ring-shaped to permit the movable grounding component to physically contact both the RF contact component and the ground contact component when it is desired to operate the upper electrode in the grounded mode. Physically separating the RF contact component and ground contact component in the Z direction is preferred in many chambers since the greater spatial separation of the RF contact component and RF ground component may reduce arcing. Some systems may not have enough room to accommodate the desired physical separation in the X-Y plane. A hat-shaped movable grounding component permits robust grounding and is physically robust and easy to manufacture when such Z-direction separation exists between the RF contact component and ground contact component.

The features and advantages of embodiments of the invention may be better understood with reference to the figures and discussions that follow.

FIG. 1 shows, in accordance with embodiments of the invention, a portion of the switching mechanism employed for selectively and alternately provide ground and RF energy to the upper electrode. In the example of FIG. 1, the switching mechanism is disposed, at least in part, in an RF match network housing. However, it is possible to implement part or all of the switching mechanism inside or outside of the match network if desired.

Referring to FIG. 1, there is shown a switching mechanism 100, which includes a RF contact component 102, a movable grounding component 104, and a ground contact component 106. In the example of FIG. 1, the movable grounding component is in the up (+Z) and non-contacting position, meaning that the RF contact component 102 is removed from ground. Actuators 108 (of which two are shown in FIG. 1) are employed to move movable grounding component 104 up and down in the Z direction as shown. In the example of FIG. 1, the actuators are air actuated although they may also employ mechanical, electromagnetic, hydraulic, electro-mechanical, etc. for actuation of movable grounding component 104 as desired.

Ground contact component 106 is coupled to a ground adaptor 112 via conductive frame 114 as shown. Ground adaptor 112 is coupled to RF ground (not shown) via an appropriate conductor or strap. Conductive frame 114 represents the bottom of the match network housing and serves to couple ground contact component 106 to ground. In the example of FIG. 1, ground contact component 106 is a ring although other shapes may also be employed, as mentioned. Preferably, ground contact component 106 is sufficiently thick and robust (since it does not have to be bendable or springy) for long life and is formed of a conductive metal (such as aluminum).

RF contact component 102 is in the form of a plate in the example of FIG. 1 and is coupled to RF strap 116 to receive RF energy from a suitable RF power supply. RF contact component 102 is also made relatively thick and robust (since it does not have to be bendable or springy) for long life. When RF contact component 102 is provided with RF energy and is not coupled to ground (such as the case in the example of FIG. 1), RF energy is provided to an upper electrode plate disposed at the bottom of the figure (not shown) via conductor 118, which is configured as a conductive rod in this example.

Movable grounding component 104 is formed of a conductive metal such as aluminum and is the form of a hat-shaped ring as shown in the example of FIG. 1. Movable grounding component 104 is also made relatively thick and robust (since it does not have to be bendable or springy) for long life. In an example embodiment, movable grounding component is formed of aluminum and is about 0.125 to about 0.5 inch thick, more preferably about 0.250 inch thick.

A hole 128 (which may be centered or off-centered) exists in movable grounding component 104 to allow RF strap 116 to pass through in a non-contacting manner. However, it is possible that movable grounding component 104 may have other shapes as discussed and may be provided with or without an RF strap hole (the RF strap may be routed in other ways, including through the side or from below, for example).

Movable grounding component 104 has a first contact area 120 and a second contact area 122 for coupling with ground contact component 106 and RF contact component 102 respectively when movable grounding component 104 is lowered in the down (−Z) direction. To improve grounding, RF gaskets 124 and 126 may be provided with ground contact component 106 and RF contact component 102 respectively. As shown in FIG. 1, RF contact component 102 is electrically insulated from ground (such as conductive frame 114 and ground adaptor 112) by an insulating component 130, which is in the form of a plastic or ceramic or other insulating collar in the example of FIG. 1. Ridges 132 are provided in insulating component 130 to lengthen the RF path from RF hot to ground when the switch arrangement is configured to operate in the RF-powered mode.

In the RF-powered mode (which refers to the mode of operation wherein the RF contact component 102 receives RF energy from strap 116 and is ungrounded and is configured to provide the received RF energy to an upper electrode via conductor 118), movable grounding component 104 is moved upward (+Z direction) by actuators 108 and is thus spatially separated from one or both of grounding contact component 106 and RF contact component 102. Accordingly, RF contact component 102 is removed from ground since it is disconnected from grounding contact component 106 and insulated from all other grounds otherwise. In this position, RF energy can be provided to the upper electrode via RF strap 116, RF contact component 102, and conductor 118. In this RF-powered mode, the plasma processing chamber is operated in the mode where the upper electrode is powered with one or more RF signals.

In the grounded mode (which refers to the mode of operation wherein the RF contact component 102 is grounded to ground contact component 106 via movable grounding component 104 and RF contact component 102 receives no RF energy from strap 116), movable grounding component 104 is moved downward (−Z direction) by actuators 108 and is thus coupled with both of grounding contact component 106 and RF contact component 102. Accordingly, RF contact component 102 is electrically coupled to ground (grounding contact component 106) via movable grounding component 104. In this grounded mode, RF contact component 102 is grounded, allowing the plasma processing chamber to operate with the upper electrode grounded as is conventional.

In one or more embodiments, the RF contact component and the ground contact component are spatially separated in the Z direction (as shown in FIG. 1) to minimize space requirement in the X-Y plane and to minimize arcing with the increased distance. Such distance and concomitant reduced arcing make these embodiments highly suitable for use in high energy, high voltage and/or high RF frequency systems where arcing is a concern when making and/or breaking contact (whether RF power contact or ground contact).

It is contemplated that other geometries and shapes for the various components are also possible. For example, although the preferred configuration is to separate the RF contact component and the ground contact component in the Z direction (as shown in FIG. 1), it is also possible to provide such separation in the X-Y plane only. In that case, the RF contact component and the ground contact component may be planar and the movable grounding component may be in the form of a plate or ring if desired.

As another example, it is possible to use a ring in the example of FIG. 1 with downward protrusions (e.g., pins or nubs) to make the grounding contact instead of using the hat-shaped ring as discussed. As another example, it is possible that the RF contact component be placed below the ground contact component and the movable grounding component be appropriately shaped or configured to ground them together when the movable grounding component moves downward in the −Z direction.

As another example, the movable grounding component may be placed below both the RF contact component and the ground contact component (using for example a ring-shaped component) and moved upward to ground the RF contact component and the ground contact component together. As another example, rod-shaped or bar shaped components may be provided instead of ring-shaped or plate-shaped or hat-shaped components for any one or multiple of the RF contact component, ground contact component, and movable grounding component to selectively and alternately provide the RF power and ground to the upper electrode.

Figure 2:
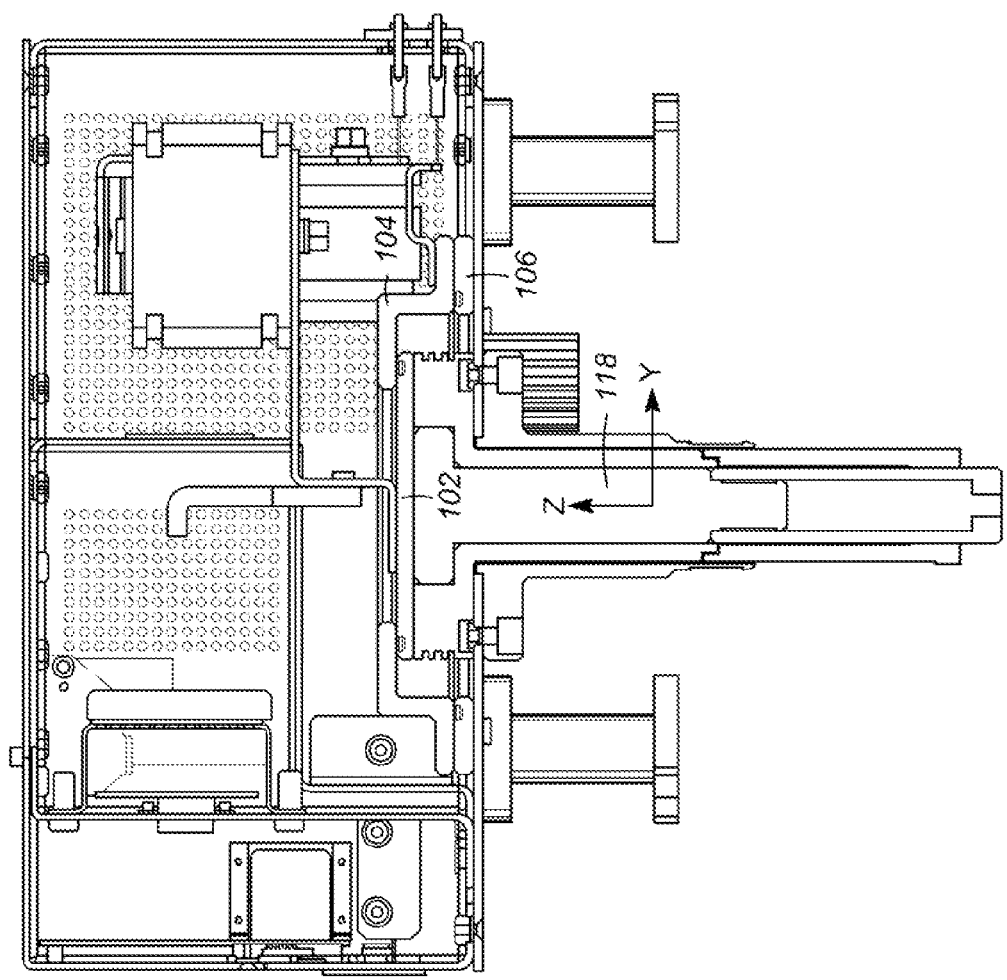
FIG. 2 shows, in accordance with embodiments of the invention, the arrangement of FIG. 1 when operated in the grounded mode.

FIG. 2 shows, in accordance with embodiments of the invention, the arrangement of FIG. 1 when operated in the grounded mode. In this grounded mode, movable grounding component 104 is lowered to establish physical contact with both ground contact component 106 and RF contact component 102 (via their respective RF gaskets in the example of FIG. 1). In this position, RF contact component 102 is grounded, allowing the plasma processing chamber to operate with the upper electrode grounded as is conventional.

Figure 3:
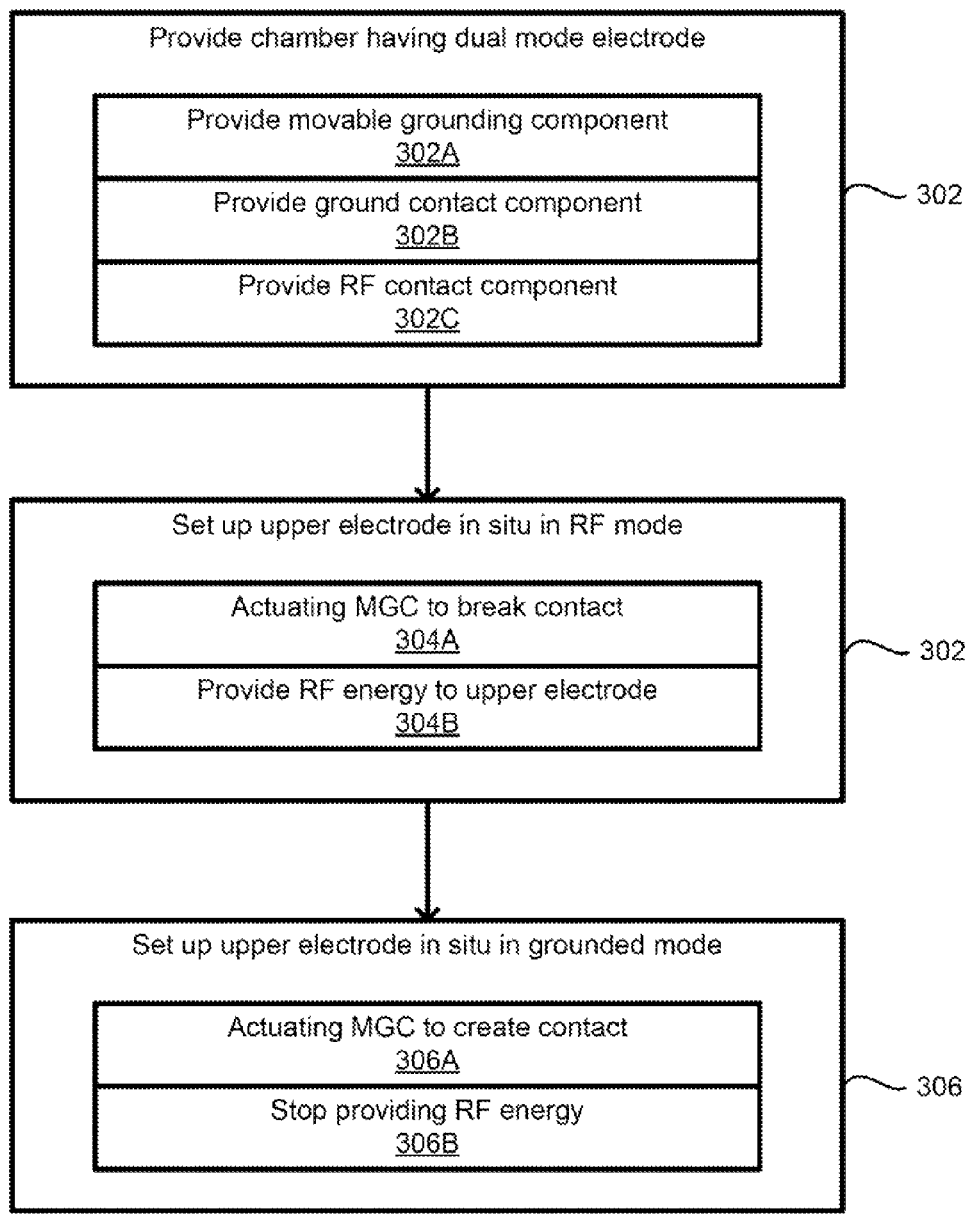
FIG. 3 shows, in accordance with an embodiment of the invention, the steps for switching the upper electrode of the plasma processing chamber from a RF powered mode to a grounded mode and vice versa.

FIG. 3 shows, in accordance with an embodiment of the invention, the steps for switching the upper electrode of the plasma processing chamber from a RF powered mode to a grounded mode and vice versa. In step 302, a plasma processing chamber having a dual-mode upper electrode is provided, including step 302A (providing a movable grounding component), step 302B (providing a ground contact component) and step 302C (providing a RF contact component). In step 304, the upper electrode is set up in-situ to operate in the RF powered mode, including step 304A (actuating the actuator to move the movable grounding component away to break contact with at least one of the ground contact component and the RF contact component) and step 304B (providing RF power to the RF contact component to energize the upper electrode with RF power). In step 306, the upper electrode is set up in-situ to operate in the grounded mode, including step 306A (actuating the actuator to move the movable grounding component to create contact with both of the ground contact component and the RF contact component) and step 306B (stop providing RF energy to the RF contact component). If desired, the movable grounding component may be moved between a first position and a second position to switch the chamber operation from a RF powered mode to a grounded mode and vice versa.

As can be appreciated from the foregoing, embodiments of the invention result in a highly robust and simple-to-manufacture switching arrangement. Bendy or resilient or springy contact elements or components, with their attendant life or cycle limits, are no longer required. By increasing the distance between the RF contact component and the ground contact component in the Z direction, less space is required in the X-Y plane to accommodate the large distance desired between the hot RF component and the ground component when the upper electrode is operating in the RF-powered mode. The increased spatial separation along with the ridge features in the insulating component contributes to reduce arcing, further improving process control and component life. Actuators permit the movable grounding component to ground and unground the RF contact component in-situ, enabling the chamber to be operated in either mode seamlessly from substrate to substrate or even while processing a single substrate.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system having at least one plasma processing chamber, comprising:
    a movable grounding component;
    an RF contact component configured to receive RF energy from an RF source when said RF source provides said RF energy to said RF contact component;
    a ground contact component coupled to ground;
    an actuator operatively coupled to said movable grounding component for disposing said movable grounding component in a first position and a second position, said first position representing a position whereby said movable grounding component is not in contact with at least one of said RF contact component and said ground contact component, said second position representing a position whereby said movable grounding component is in contact with both said RF contact component and said ground contact component; and
    wherein said movable grounding component is rigid.

2. The plasma processing system of claim 1 wherein said movable grounding component is hat-shaped.

3. The plasma processing system of claim 1 wherein said movable grounding component is plate-shaped.

4. The plasma processing system of claim 1 wherein said RF contact component is coupled to a conductor that is configured to provide said RF energy to an upper electrode.

5. The plasma processing system of claim 1 wherein said movable grounding component is physically apart from both said RF contact component and said ground component in said first position.

6. The plasma processing system of claim 1 wherein said RF contact component represents a plate, said movable grounding component having a hat shape having a hole disposed through said hat shape, said ground contact component represents a ring disposed in an offset relationship with said RF contact component in a Z direction.

7. The plasma processing system of claim 1 wherein said RF contact component represents a plate, said ground contact component represents a ring disposed co-planar with said RF contact component in a Z direction.

8. A method for configuring plasma processing system having at least one plasma processing chamber to have an electrode capable of operating in the alternative a grounded mode and an RF mode, comprising:
    providing a movable grounding component;
    providing an RF contact component configured to receive RF energy;
    providing a ground contact component coupled to ground;
    coupling an actuator to said movable grounding component for disposing said movable grounding component in a first position and a second position, said first position representing a position whereby said movable grounding component is not in contact with at least one of said RF contact component and said ground contact component, said second position representing a position whereby said movable grounding component is in contact with both said RF contact component and said ground contact component; and
    wherein said movable grounding component is rigid.

9. The method of claim 8 wherein said movable grounding component is hat-shaped.

10. The method of claim 8 wherein said movable grounding component is plate-shaped.

11. The method of claim 8 further comprising coupling said RF contact component to a conductor that is configured to provide said RF energy to an upper electrode.

12. The method of claim 8 wherein said movable grounding component is physically apart from both said RF contact component and said around component in said first position.

13. The method of claim 8 wherein said RF contact component represents a plate, said movable grounding component having a hat shape having a hole disposed through said hat shape, said ground contact component represents a ring disposed in an offset relationship with said RF contact component in a Z direction.

14. The method of claim 8 wherein said RF contact component represents a plate, said ground contact component represents a ring disposed co-planar with said RF contact component in a Z direction.

15. A plasma system, comprising,
    a plasma processing chamber;
    an electrode coupled to the plasma processing chamber;
    an RF contact component that is electrically coupled to the electrode and is configured to receive radio frequency (RF) power;
    a ground contact component coupled to ground;
    a moveable grounding component that is constructed to be rigid;
    an actuator operatively coupled to said movable grounding component for placing said movable grounding component in a first position and a second position,
        wherein said first position is a position where said movable grounding component is not in contact with said RF contact component and said ground contact component;
        wherein said second position is a position where said movable grounding component is in electrical contact with both said RF contact component and said ground contact component.

* * * * *